(12) United States Patent
Lee et al.

(10) Patent No.: US 10,566,318 B2
(45) Date of Patent: Feb. 18, 2020

(54) LIGHT EMITTING DEVICE PACKAGE AND DISPLAY DEVICE USING THE SAME

(71) Applicant: Samsung Electronics Co., Ltd., Suwon-si, Gyeonggi-do (KR)

(72) Inventors: Dong Gun Lee, Hwaseong-si (KR); Yong Il Kim, Seoul (KR); Hye Seok Noh, Suwon-si (KR); Han Kyu Seong, Seoul (KR); Sung Hyun Sim, Uiwang-si (KR); Ha Nul Yoo, Bucheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/008,276

(22) Filed: Jun. 14, 2018

(65) Prior Publication Data

US 2019/0189595 A1    Jun. 20, 2019

(30) Foreign Application Priority Data

Dec. 14, 2017    (KR) .................. 10-2017-0172166

(51) Int. Cl.
*H01L 25/075* (2006.01)
*H01L 33/50* (2010.01)
(Continued)

(52) U.S. Cl.
CPC ...... *H01L 25/0753* (2013.01); *H01L 27/1214* (2013.01); *H01L 33/504* (2013.01); *H01L 33/505* (2013.01); *H01L 33/54* (2013.01); *H01L 33/62* (2013.01); *H01L 33/06* (2013.01); *H01L 33/30* (2013.01); *H01L 33/32* (2013.01); *H01L 33/405* (2013.01); *H01L 33/60* (2013.01); *H01L 2933/005* (2013.01); *H01L 2933/0033* (2013.01);
(Continued)

(58) Field of Classification Search
CPC . H01L 25/0753; H01L 33/504; H01L 33/505; H01L 33/508; H01L 33/405; H01L 33/54; H01L 33/60; H01L 33/62; H01L 33/06; H01L 33/30; H01L 33/32; H01L 27/1214
USPC ....... 257/88, 89, 91, 103, E27.121, E33.045, 257/E33.046, E33.061, E33.062, E33.066; 313/494, 495, 496; 362/97.1, 235; 438/22, 24, 128, 612, 613
See application file for complete search history.

(56) References Cited

U.S. PATENT DOCUMENTS 6,372,608 B1    4/2002   Shimoda et al.
6,645,830 B2    11/2003  Shimoda et al.
(Continued)

*Primary Examiner* — Dao H Nguyen
(74) *Attorney, Agent, or Firm* — Lee IP Law, P.C.

(57) ABSTRACT

A light emitting device package includes a first wavelength conversion portion and a second wavelength conversion portion to provide a wavelength of incident light to provide light having a converted wavelength, a light-transmissive partition structure extending along side surfaces of the first and second wavelength conversion portions along a thickness direction to separate the first and second wavelength conversion portions part from each other along a direction crossing the thickness direction, and a cell array including a first light emitting device, a second light emitting device and a third light emitting device, overlapping the first wavelength conversion portion, the second wavelength conversion portion and the light-transmissive partition structure, respectively, along the thickness direction.

19 Claims, 13 Drawing Sheets

(51) Int. Cl.
    *H01L 33/54*    (2010.01)
    *H01L 33/62*    (2010.01)
    *H01L 27/12*    (2006.01)
    *H01L 33/60*    (2010.01)
    *H01L 33/06*    (2010.01)
    *H01L 33/32*    (2010.01)
    *H01L 33/30*    (2010.01)
    *H01L 33/40*    (2010.01)

(52) U.S. Cl.
    CPC ............... *H01L 2933/0041* (2013.01); *H01L 2933/0058* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,598,619 B2 * | 12/2013 | Kim | H01L 27/156 257/103 |
| 8,735,931 B2 | 5/2014 | Han et al. | |
| 8,766,295 B2 | 7/2014 | Kim | |
| 9,391,051 B2 * | 7/2016 | Rhee | H01L 25/0753 |
| 9,711,692 B2 | 7/2017 | Rhee | |
| 2012/0014091 A1 * | 1/2012 | He | H01L 25/0753 362/97.1 |
| 2015/0362165 A1 * | 12/2015 | Chu | H01L 25/0753 362/235 |
| 2017/0092820 A1 | 3/2017 | Kim et al. | |
| 2017/0200765 A1 | 7/2017 | Choi et al. | |
| 2017/0236866 A1 | 8/2017 | Lee et al. | |
| 2017/0244010 A1 | 8/2017 | Kim et al. | |
| 2017/0250316 A1 | 8/2017 | Yeon et al. | |
| 2017/0250323 A1 | 8/2017 | Otto et al. | |
| 2017/0286044 A1 | 10/2017 | Kim et al. | |
| 2018/0182931 A1 | 6/2018 | Lee et al. | |

* cited by examiner

LIGHT EMITTING DEVICE PACKAGE AND DISPLAY DEVICE USING THE SAME

CROSS-REFERENCE TO RELATED APPLICATION(S)

Korean Patent Application No. 10-2017-0172166 filed on Dec. 14, 2017, in the Korean Intellectual Property Office, and entitled: "Light Emitting Device Package and Display Device Using the Same," is incorporated by reference herein in its entirety.

BACKGROUND

1. Field

Embodiments relate to a light emitting device package, and a display device using the same.

2. Description of the Related Art

Light emitting devices such as semiconductor light emitting diode (LED) devices have been used as light sources in various electronic products, as well as light sources for lighting devices. In particular, light emitting devices are widely used as light sources in various types of display devices such as televisions, mobile phones, personal computers (PCs), laptop PCs, and personal digital assistants (PDAs).

Conventional display devices include display panels, commonly liquid crystal display (LCD) panels, as well as backlight units. However, in recent years, display devices which do not require additional backlight units, through using an LED device as a single pixel, have been under development. Such display devices may have a compact size, and may be implemented as high brightness displays having improved optical efficiency, compared to LCDs of the related art. Display devices may also allow an aspect ratio of a display image to be freely changed, and may be implemented as large display devices, thereby providing various forms of large displays.

SUMMARY

According to an aspect, a light emitting device package includes a first wavelength conversion portion and a second wavelength conversion portion to convert a wavelength of incident light to provide light having a converted wavelength, a light-transmissive partition structure extending along side surfaces of the first and second wavelength conversion portions in a thickness direction to separate the first and second wavelength conversion portions from each other along a direction crossing the thickness direction, and a cell array including a first light emitting device, a second light emitting device and a third light emitting device, overlapping the first wavelength conversion portion, the second wavelength conversion portion and the light-transmissive partition structure, respectively, along the thickness direction, the cell array having a first surface and a second surface opposing the first surface, the first surface being closer to the first wavelength conversion portion, the second wavelength conversion portion, and the light-transmissive partition structure.

According to an aspect, a light-transmissive partition structure including a first recess and a second recess penetrating in a thickness direction and spaced apart from each other, a first wavelength conversion portion and a second wavelength conversion portion to fill the first recess and the second recess, respectively, and to convert a wavelength of incident light to provide light having a converted wavelength, and a cell array including a first light emitting device, a second light emitting device and a third light emitting device, overlapping the first wavelength conversion portion, the second wavelength conversion portion and the light-transmissive partition structure, respectively, along the thickness direction.

According to an aspect, a display device includes a display panel including a circuit board and a plurality of light emitting device packages arranged in rows and columns on the circuit board, each of the plurality of light emitting device packages providing a single pixel, a driving unit driving the display panel, and a control unit controlling the driving unit. The display panel includes a first wavelength conversion portion and a second wavelength conversion portion to convert a wavelength of incident light to provide light having a converted wavelength, a light-transmissive partition structure extending along side surfaces of the first and second wavelength conversion portions in a thickness direction to separate the first and second wavelength conversion portions from each other, and a cell array including a first light emitting device, a second light emitting device and a third light emitting device, overlapping the first wavelength conversion portion, the second wavelength conversion portion and the light-transmissive partition structure, respectively, along the thickness direction.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, various example embodiments will be described in detail with reference to the accompanying drawings.

Figure 1:
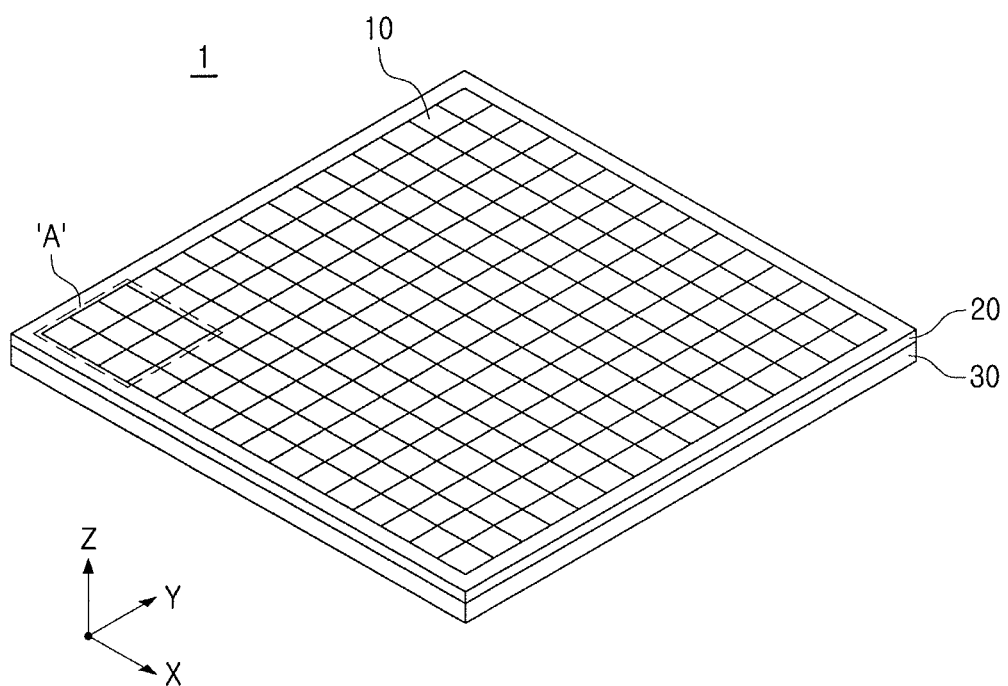
FIG. 1 illustrates a schematic perspective view of a display device including a light emitting device package according to an example embodiment.
Figure 2:
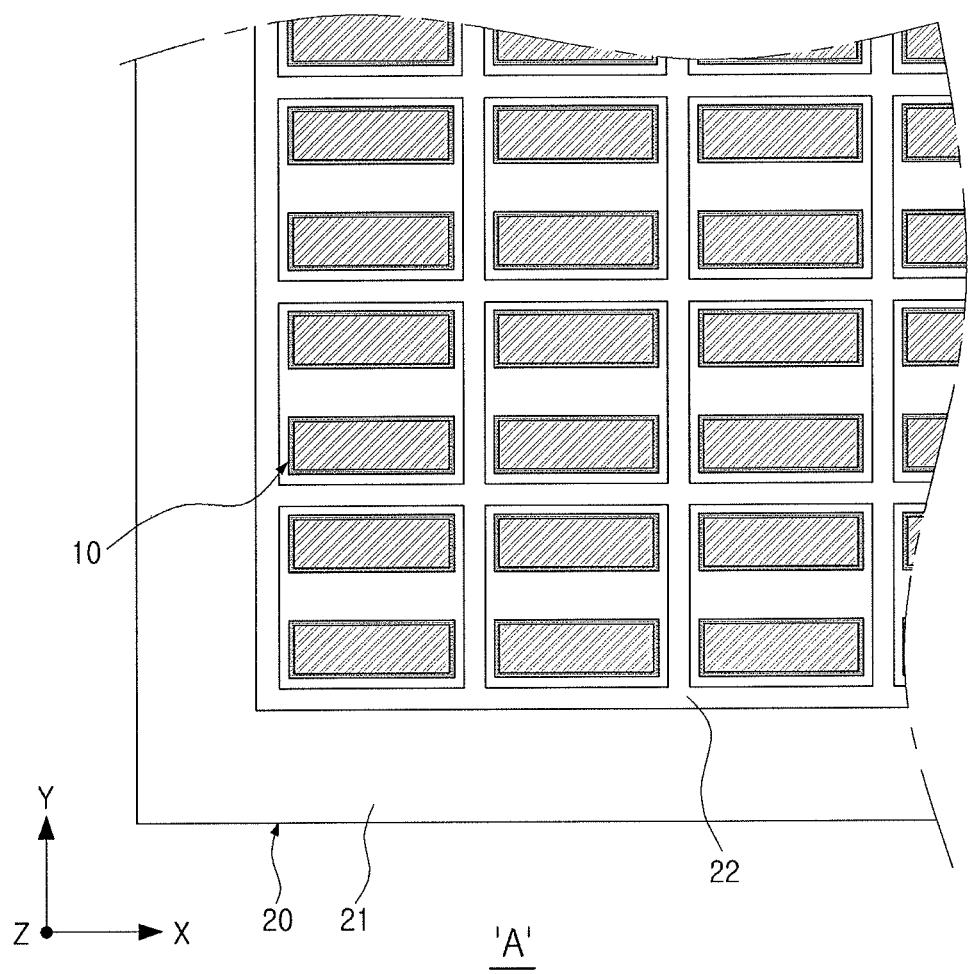
FIG. 2 illustrates an enlarged plan view of portion 'A' of FIG. 1.

FIG. 1 is a schematic perspective view of a display device including a light emitting device package according to an example embodiment. FIG. 2 is an enlarged plan view of portion 'A' of FIG. 1.

Referring to FIG. 1, a display device 1 may include a circuit board 30 and a display panel 20 arranged on the circuit board 30.

The display panel 20 according to the example embodiment may include a plurality of light emitting device packages 10 capable of emitting a mixture of red (R), green (G) and blue (B) light. Each of the plurality of light emitting device packages 10 may constitute a single pixel of the display panel. The plurality of light emitting device packages 10 may be arranged in rows and columns on the circuit board 30. In the example embodiment, although a configuration in which the light emitting device packages 10 of 15×15 are arranged is illustrated for convenience of description, in actually, larger number of light emitting device packages, for example, 1024×768 or 1920×1080 light emitting device packages, may be arranged, depending on a required resolution.

Each of the light emitting device packages 10 may include a plurality of subpixels corresponding to RGB light sources. The plurality of subpixels in one light emitting device package 10 may be disposed to be adjacent to each other, which will be described in detail with reference to FIGS. 3 to 6. A subpixel color is not limited to RGB, and various colors, e.g., cyan, yellow, magenta and black (CYMK) may also be used. In addition, the example embodiment illustrates that three subpixels corresponding to RGB light sources, respectively, are included in a single pixel, but is not limited thereto. For example, four or more subpixels may also be included in a single pixel.

A driving unit configured to supply power to respective light emitting device packages 10 of the display panel 20, and a control unit controlling the driving unit, may on the circuit board 30. The circuit board 30 may include a circuit configured to independently drive subpixels of respective pixels. For example, the circuit board 30 may be a thin film transistor (TFT) substrate including a thin film transistor (TFT).

Referring to FIG. 2, the display panel 20 may further include a first partition structure 21 defining a region in which the plurality of light emitting device packages 10 are disposed. In addition, the plurality of light emitting device packages 10 may be respectively disposed to be surrounded by a second partition structure 22. The second partition structure 22 may electrically isolate respective light emitting device packages 10, such that each light emitting device package 10 may be independently driven as a single pixel. In addition, the second partition structure 22 may firmly fix the plurality of light emitting device packages 10 on the circuit board 30.

The first and second partition structures 21 and 22 may include a black matrix. For example, the black matrix may be disposed around the circuit board, to serve as a guide line defining mounting regions of the plurality of light emitting device packages 10. The matrix is not limited to black, and other colors may be used. For example, a white matrix, a green matrix, or the like may be used depending on the use, the location of product use, or the like. A transparent matrix may also be used. The white matrix may further include a reflective material or a light scattering material. The black matrix may include at least one of materials including a ceramic, a semiconductor or a metal, or a polymer including a resin.

Figure 3:
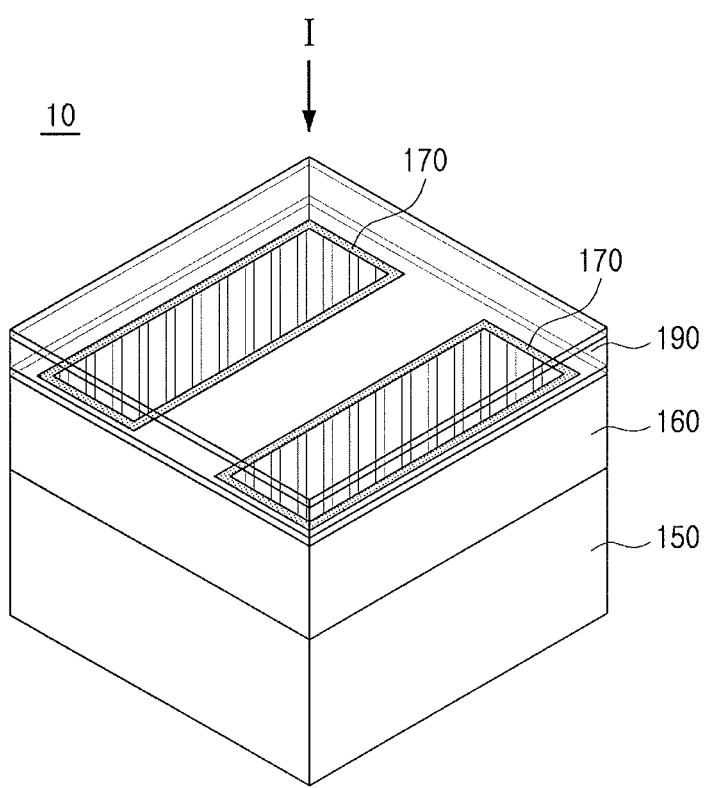
FIG. 3 illustrates a schematic perspective view of the light emitting device package of FIG. 2.
Figure 4:
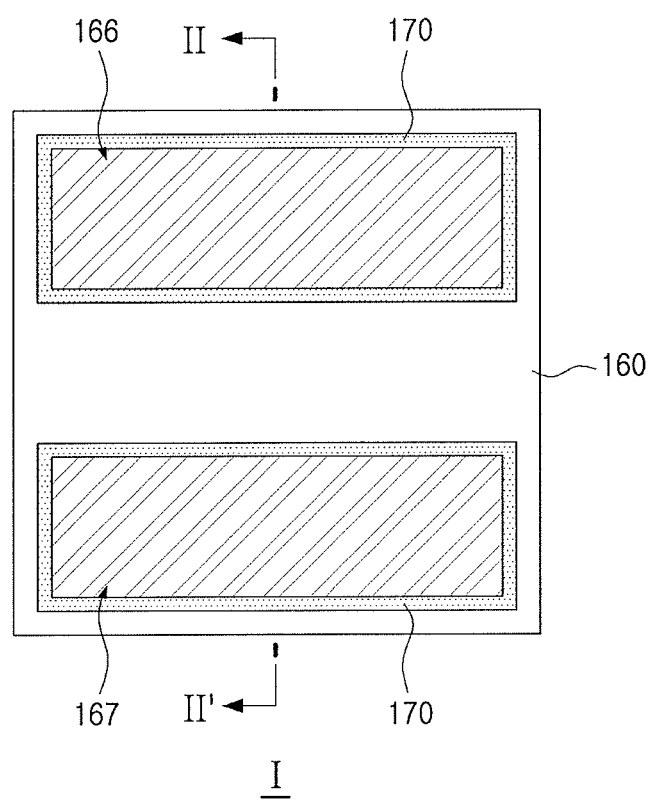
FIG. 4 illustrates a plan view of the light emitting device package viewed in direction 'I' in FIG. 3.
Figure 5:
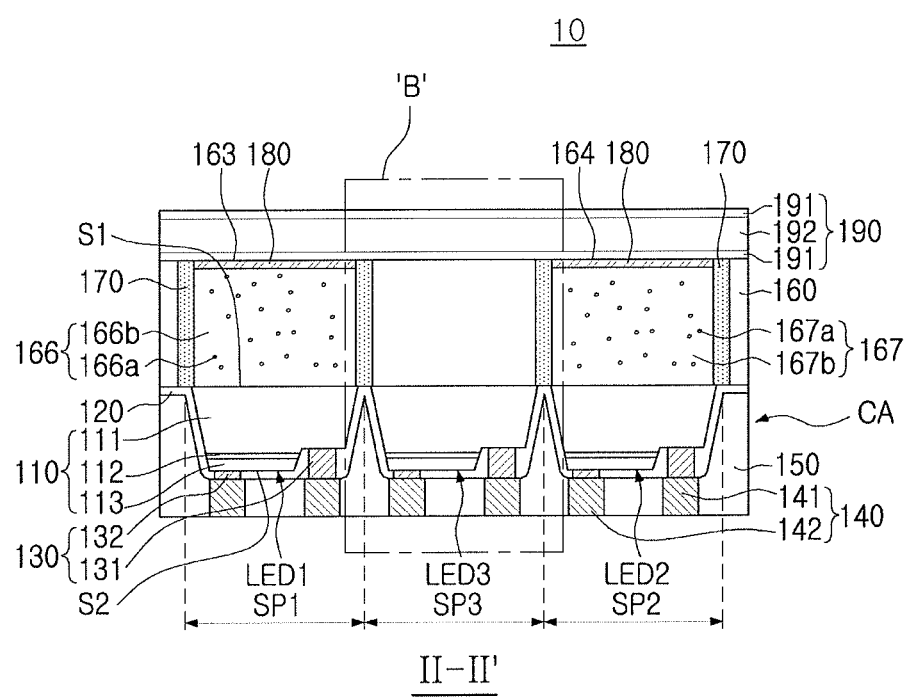
FIG. 5 illustrates a cutaway side cross-sectional view taken along line II-II' of FIG. 4.
Figure 6:
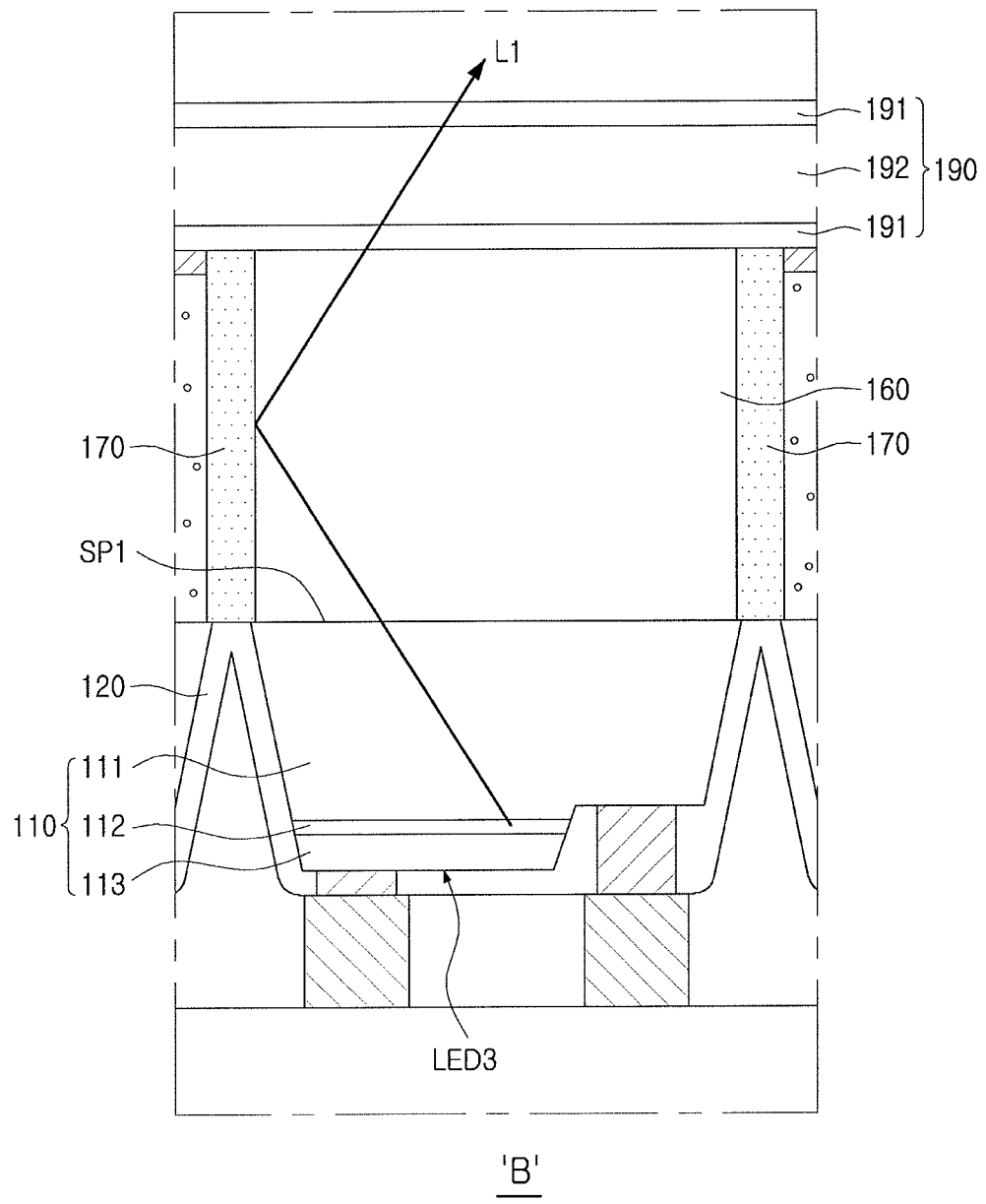
FIG. 6 illustrates an enlarged view of portion 'B' of FIG. 5.

FIG. 3 is a schematic perspective view of the light emitting device package of FIG. 2, and FIG. 4 is a plan view of the light emitting device package, viewed in direction 'I' of FIG. 3. FIG. 5 is a cutaway side cross-sectional view taken along line II-II' of FIG. 4, and FIG. 6 is an enlarged view of portion 'B' of FIG. 5.

Referring to FIGS. 3 to 5, the light emitting device package 10 forming a single pixel may include a cell array CA including first, second and third light emitting devices LED1, LED2 and LED3, first and second wavelength conversion portions 166 and 167, and a light-transmissive partition structure 160 separating the first and second wavelength conversion portions 166 and 167 from each other. The light emitting device package 10 according to an example embodiment may be a chip scale package (CSP) or a wafer level package (WLP).

The light emitting device package 10 may include first, second, and third subpixels SP1, SP2, and SP3, corresponding to RGB light sources of a single pixel, respectively. The first and second subpixels SP1 and SP2 may include the first and second light emitting devices LED1 and LED2, and the first and second wavelength conversion portions 166 and 167, respectively, and the third subpixel SP3 may only include the light-transmissive partition structure 160 and the third light emitting device LED3, i.e., without a wavelength conversion portion. Thus, light emitted by the first and second light emitting devices LED1 and LED2 may be converted into light having a different wavelength through the wavelength conversion portions, to then be emitted, while light emitted by the third light emitting device LED3 may be emitted as is through the light-transmissive partition structure 160.

The first, second and third light emitting devices LED1, LED2, and LED3 may be arranged to be parallel to each other, while being adjacent to each other. The third light emitting device LED3 may be between the first light emitting device LED1 and the second light emitting device LED2. The first, second, and third light emitting devices LED1, LED2 and LED3 may be adjacent to each other within a range appropriate to not electrically affect each other. For example, as an insulating layer 120 to be described later may be disposed between the first, second and third light emitting devices LED1, LED2, and LED3, the first to third light emitting devices LED1 to LED3 may be disposed to have an interval sufficient to maintain electrical insulation therebetween.

The cell array CA may include the first, second, and third light emitting devices LED1, LED2, and LED3 each including a first conductivity-type semiconductor layer 111, an active layer 112, and a second conductivity-type semiconductor layer 113, stacked along a Z direction. Each stack may have a first surface S1, e.g., adjacent the light-transmissive partition structure 160, and a second surface S2 opposing the first surface S1 along the Z direction.

The first, second and third light emitting devices LED1, LED2, and LED3 may include a light emitting structure 110 in which epitaxial layers, e.g., the first conductivity-type semiconductor layer 111, the active layer 112, and the second conductivity-type semiconductor layer 113, are stacked, as illustrated in FIGS. 5 and 6. The epitaxial layers may be grown by the same process in a single wafer. The active layers 112 of the first, second, and third light emitting devices LED1, LED2, and LED3 may be configured to emit the same light. For example, the active layer 112 may emit blue light, e.g., 440 nm to 460 nm. The first, second and third light emitting devices LED1, LED2, and LED3 may have the same structure, and the first light emitting device LED1 will mainly be described to avoid duplication of descriptions.

The first conductivity-type semiconductor layer 111 may provide the first surface S1 of the cell array CA, and the second conductivity-type semiconductor layer 113 may provide the second surface S2 of the cell array CA. The first conductivity-type semiconductor layer 111 and the second conductivity-type semiconductor layer 113 may be provided as an n-type semiconductor layer and a p-type semiconductor layer, respectively, and for example, may be a nitride semiconductor of $Al_xIn_yGa_{(1-x-y)}N$ ($0 \leq x \leq 1$, $0 \leq y \leq 1$, $0 \leq x+y \leq 1$). The active layer 112 may have a multiple quantum well (MQW) structure in which a quantum well layer and a quantum barrier layer are alternately stacked. For example, the active layer 122 may have a nitride-based MQW structure, such as InGaN/GaN or GaN/AlGaN, but the structure thereof is not limited thereto. The active layer 122 may be a different semiconductor such as GaAs/AlGaAs, InGaP/GaP or GaP/AlGaP.

According to an example embodiment, an uneven pattern may be formed on the first surface S1 of the cell array CA, and thus, light extraction efficiency may be further improved. The uneven pattern may be obtained by wet-etching an exposed surface of the first conductivity-type semiconductor layer 111 or by dry-etching the exposed surface of the first conductivity-type semiconductor layer 111 using plasma.

The cell array CA may include the insulating layer 120 on the second surface to surround the respective first, second, and third light emitting devices LED1, LED2, and LED3. In particular, the insulating layer 120 may extend under respective first, second, and third light emitting devices LED1, LED2, and LED3, and along sidewalls thereof. Thus, the insulating layer 120 may electrically isolate the first, second, and third light emitting devices LED1, LED2, and LED3 from one another.

As illustrated in FIG. 6, the insulating layer 120 may be in contact, e.g., direct contact, with a reflective layer 170 extending through the light-transmissive partition structure 16 along the Z direction, to prevent the occurrence of a so-called, light leakage phenomenon among the first, second, and third subpixels SP1, SP2, and SP3. For example, light L1 emitted by the third light emitting device LED3 may be optically shielded from interfering with light emitted by the first and second light emitting devices LED1 and LED2.

The insulating layer 120 may be formed of an electrical insulating material. For example, the insulating layer 120 may be formed of a silicon oxide, a silicon oxynitride, or a silicon nitride. In addition, the insulating layer 120 may further include a material having a relatively low light absorption rate or reflective properties or may have a reflective structure. The insulating layer 120 prevents mutual optical interference between the first, second, and third light emitting devices LED1, LED2, and LED3, to secure independent driving of the first, second, and third light emitting devices LED1, LED2, and LED3. In a specific example, the insulating layer 120 may include a distributed Bragg reflector (DBR) structure in which a plurality of insulating films having different refractive indices are alternately stacked. In such a DBR structure, a plurality of insulating films having different refractive indexes may be repeatedly and alternately stacked two to 100 times. A material of the plurality of insulating films may be selected from among oxides or nitrides of $SiO_2$, $SiN$, $SiO_xN_y$, $TiO_2$, $Si_3N_4$, $Al_2O_3$, $ZrO_2$, TiN, AlN, TiAlN, TiSiN and the like.

Each of the first, second and third light emitting devices LED1, LED2, and LED3 may include an electrode portion 130 to apply power to the first conductivity-type semiconductor layer 111 and the second conductivity-type semiconductor layer 113. The electrode portion 130 may include first and second electrodes 131 and 132 spaced apart from each other along a direction crossing the thickness or Z direction. The first and second electrodes 131 and 132 may be disposed in a mesa-etched region of the first conductivity-type semiconductor layer 111 and the second conductivity-type semiconductor layer 113, respectively. For example, the first electrode 131 may include at least one of aluminum (Al), gold (Au), chromium (Cr), nickel (Ni), titanium (Ti) and tin (Sn), and the second electrode 132 may be formed of a reflective metal. For example, the second electrode 132 may include a material such as silver (Ag), Ni, Al, Cr, rhodium (Rh), palladium (Pd), iridium (Ir), ruthenium (Ru), magnesium (Mg), zinc (Zn), platinum (Pt), Au or the like, and may be employed in a single layer or a two or more layer structure.

Each of the first, second and third light emitting devices LED1, LED2, and LED3 may include an electrode pad part 140 applying power to the light emitting device package 10. The electrode pad part 140 may include first and second electrode pads 141 and 142. The first and second electrode pads 141 and 142 may be connected to the first and second electrodes 131 and 132, respectively.

The light emitting device package 10 may include a molding part 150 exposing the electrode pad part 140 while embedding a lower surface of the cell array CA, e.g., the electrode pad part 140 may extend along the Z direction through the molding part 150. The molding part 150 may have a relatively high Young's modulus to firmly support the light emitting device package 10. The molding part 150 may include a material having relatively high thermal conductivity to effectively dissipate heat generated by the first, second and third light emitting devices LEL1, LED2, and LED3. For example, the molding part 150 may include an epoxy resin or a silicone resin. In addition, the molding part 150 may include light reflective particles to reflect light. As the light-reflective particles, titanium dioxide ($TiO_2$) or aluminum oxide ($Al_2O_3$) particles may be used, but the light-reflective particles are not limited thereto.

The first, second and third light emitting devices LED1, LED2 and LED3 may be arranged to have the same area when viewed in direction T. Alternatively, the first, second and third light emitting devices LED1, LED2, and LED3 may be arranged to have different areas in a plan view.

The light-transmissive partition structure 160 may be in contact, e.g., direct contact, with the first surface S1 of the cell array CA, and may include first and second recesses 163 and 164. The first and second recesses 163 and 164 may serve as spaces for the formation of the first and second wavelength conversion portions 166 and 167, respectively.

In the light-transmissive partition structure 160, the first and second recesses 163 and 164 filled with the first and second wavelength conversion portions 166 and 167 may be formed to penetrate, e.g., fully penetrate, the light-transmissive partition structure 160 in a thickness direction, e.g., the Z direction, and may be spaced apart from each other along a direction crossing the thickness direction. The first and second recesses 163 and 164 may overlap the first and second light emitting devices LED1 and LED2, respectively, along the thickness or Z direction. The third light emitting device LED3 may be in a region separating the first and second recesses 163 and 164. Thus, light emitted by the first and second light emitting devices LED1 and LED2 may be emitted through the first and second wavelength conversion portions 166 and 167, and light emitted by the third light emitting device LED3 may be emitted through, e.g., directly through, the light-transmissive partition structure 160.

The light-transmissive partition structure 160 may be formed of a transparent material having insulating properties. For example, the light-transmissive partition structure 160 may be formed of at least one of $SiO_2$, $SiN_x$, $Al_2O_3$, HfO, or ZrO. In addition, according to an example embodiment, the light-transmissive partition structure 160 may be formed as a structure in which a plurality of layers are stacked.

The first and second wavelength conversion portions 166 and 167 may be in the first and second recesses 163 and 164, respectively. The first and second wavelength conversion portions 166 and 167 may be directly on the first surface S1 of the first and second light emitting devices LED1 and LED2. Alternatively, an additional surface, e.g., a portion of the light-transmissive partition structure 160, may be between the first and second wavelength conversion portions 166 and 167, and the first surfaces of the first and second light emitting devices LED1 and LED2.

The first and second recesses 163 and 164 may have a predetermined depth in positions thereof corresponding to locations of the first and second light emitting devices LED1 and LED2, respectively. The first and second recesses 163 and 164 may be modified to have various shapes. For example, as illustrated in FIGS. 3 to 5, the first and second recesses 163 and 164 may be formed to respectively have a quadrangular columnar space when viewed in direction 'I'. The first and second recesses 163 and 164 may penetrate, e.g., fully penetrate, through the light-transmissive partition structure 160, along the thickness direction, to have the same depth, and may also have different depths by including a light-transmitting material layer, e.g., material used for the light-transmissive partition structure 160, on the first surface S1 of the first and second light emitting devices LED1 and LED2.

A width of each of the first and second recesses 163 and 164 may be substantially the same as a distance by which the first and second recesses 163 and 164 are spaced apart from each other along a direction crossing the thickness direction. Thus, the first and second wavelength conversion portions 166 and 167 provided in the first and second recesses 163 and 164, respectively, may each have a width that is substantially the same as a distance by which the first and second wavelength conversion portions 166 and 167 are spaced apart from each other.

The first and second wavelength conversion portions 166 and 167 may be formed by dispersing a wavelength conversion material, e.g., a phosphor or quantum dot (QD), in a resin, e.g., silicone. In an example embodiment, the first and second recesses 163 and 164 may include a phosphor or a quantum dot capable of performing wavelength conversion of blue light into red light and green light, respectively.

The first and second wavelength conversion portions 166 and 167 may be formed by filling the first and second recesses 163 and 164 with the wavelength converting material and then curing the wavelength converting material. In detail, the first and second wavelength conversion portions 166 and 167 may be formed by providing, e.g., dispensing or inkjet-printing, light-transmissive liquid resins 166b and 167b mixed with red phosphors 166a and green phosphors 167a, in the first and second recesses 163 and 164, and then curing the light-transmissive liquid resins.

An optical filter layer 180 or a distributed Bragg reflector (DBR) may be further on respective upper surfaces of the first and second wavelength conversion portions 166 and 167, e.g. between the first and second wavelength conversion portions 166 and 167 and output surface of the light emitting device 10. The optical filter layer 180 or the DBR may selectively block light of specific wavelength(s), as required, e.g., to provide more pure red light and green light, respectively. In an example embodiment, light of a specific wavelength may be blue light emitted by the first and second light emitting devices LED1 and LED2, and the optical filter layer 180 or the DBR may be provided to selectively block blue light. Thus, by using the optical filter layer 180 or the DBR, the first and second subpixels SP1 and SP2 may provide light from which blue light has been removed.

As illustrated in FIG. 5, the reflective layer 170 may be respectively disposed on lateral surfaces of the first and second recesses 163 and 164, to reflect light emitted by the first and second light emitting devices LED1 and LED2. The reflective layer 170 may be disposed to cover the entirety of the lateral surfaces of the first and second recesses 163 and 164. Thus, the reflective layer 170 may serve as light emitting windows separately emitting light emitted by the first and second light emitting devices LED1 and LED2.

The reflective layer 170 may be in contact, e.g., direct contact, with the insulating layer 120, and may overlap upper portions of the insulating layer 120 on sidewalls of light emitting devices along the Z direction to prevent light leakage from occurring among the first, second, and third subpixels SP1, SP2, and SP3. For example, light emitted by the first and second light emitting devices LED1 and LED2 may be optically shielded from interfering with each other. The reflective layer 170 may reflect light emitted by the first and second light emitting devices LED1 and LED2, to focus or direct the light toward the front of the light emitting device package 10 in the direction 'I' (see FIG. 3). The reflective layer 170 may be formed of a material including a relatively high reflectivity metal, e.g., including at least one of aluminum (Al), ruthenium (Ru), rhodium (Rh), gold (Au), silver (Ag), platinum (Pt), nickel (Ni), chromium (Cr), titanium (Ti), and copper (Cu).

Further, as illustrated in FIGS. 5 and 6, the reflective layer 170 may reflect light L1 emitted by the third light emitting device LED3 of the third subpixel SP3 adjacent thereto, to focus or direct the light to the front of the light emitting device package 10 in the direction 'I' (see FIG. 3).

The light-transmissive partition structure 160 may serve as a partition separating the first and second wavelength conversion portions 166 and 167 from each other, and may serve as a light waveguide, through which light emitted by the third light emitting device LED3 is transmitted.

An encapsulation portion 190 to prevent deterioration of a wavelength conversion material may be on upper portions of the light-transmissive partition structure 160 and the first and second wavelength conversion portions 166 and 167. The encapsulation portion 190 may be in contact with the first and second wavelength conversion portions 166 and 167, and the light-transmissive partition structure 160, such that the encapsulation portion may serve as a light waveguide transmitting light emitted by the first and second wavelength conversion portions 166 and 167, and the light-transmissive partition structure 160. The encapsulation portion 190 may have a multilayer structure in which an organic layer 192 is between oxide layers 191. Alternatively, the encapsulation portion 190 may have a single-layer structure.

Figure 7:
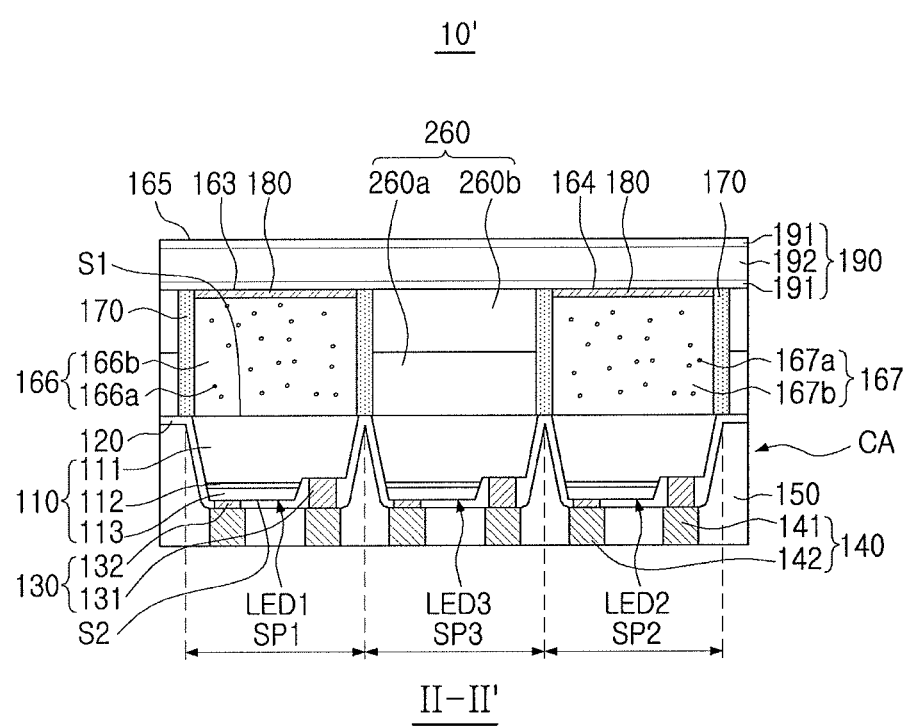
FIG. 7 illustrates a side cross-sectional view of a light emitting device package according to an example embodiment.

FIG. 7 is a drawing of an example in which a light-transmissive partition structure 260 of a light emitting device package 10' has a multilayer structure including a first layer 260a and a second layer 260b. The first layer 260a and the second layer 260b may be formed of different materials to have different refractive indices. For example, the second layer 260b may be formed to have an intermediate refractive index to alleviate a difference in refractive indices between the first layer 260a, e.g., a material of the light-transmissive partition structure 160, and the encapsulation portion 190.

Typically, to prevent light emitted by subpixels of a display panel from interfering with each other, a partition structure having a light blocking effect, e.g., an opaque partition structure, is employed between the subpixels. As resolution of the display panel increases, the size of pixels decreases. However, there is a limit as to how much a thickness of the opaque partition structure may be reduced while still preventing light emitted by subpixels from interfering. Thus, even when the size of the pixel is reduced, a thickness of a partition may not be reduced accordingly. As a result, the display panel has a high resolution, but an amount of light emitted by each pixel is reduced, thereby reducing the amount of light emitted from the entirety of a display panel.

In contrast, in the light emitting device package 10 according to an example embodiment, by using the light-transmissive partition structure with one of subpixels beneath the light-transmissive partition structure, a distance between subpixels may be significantly reduced, and the size of subpixels may be significantly increased while maintaining high resolution. Thus, the light emitting device package 10 according to an example embodiment may be further miniaturized, while maintaining brightness.

Next, a process of manufacturing a light emitting device package will be described with reference to FIGS. 8 to 13. FIGS. 8 to 13 are schematic side cross-sectional views of main stages of a process of manufacturing the light emitting device package of FIG. 5. Configurations of the same reference numerals as those of the light emitting device package 10 described above will be omitted to avoid duplication of descriptions.

In detail, a method of manufacturing the light emitting device package may be related to a method of manufacturing a chip scale package. Such a chip scale package may be implemented to have substantially the same package size as the semiconductor light emitting device. Thus, for example, when the chip scale package is used in a display panel, as a pixel size and a pixel pitch are reduced, a relatively high-resolution display panel may be manufactured. In addition, all processes may be performed at the wafer level, and thus, may be suitable for mass production. Furthermore, an optical structure, e.g., a wavelength conversion portion and an optical filter, may be integrally manufactured together with a light emitting structure.

Figure 8:
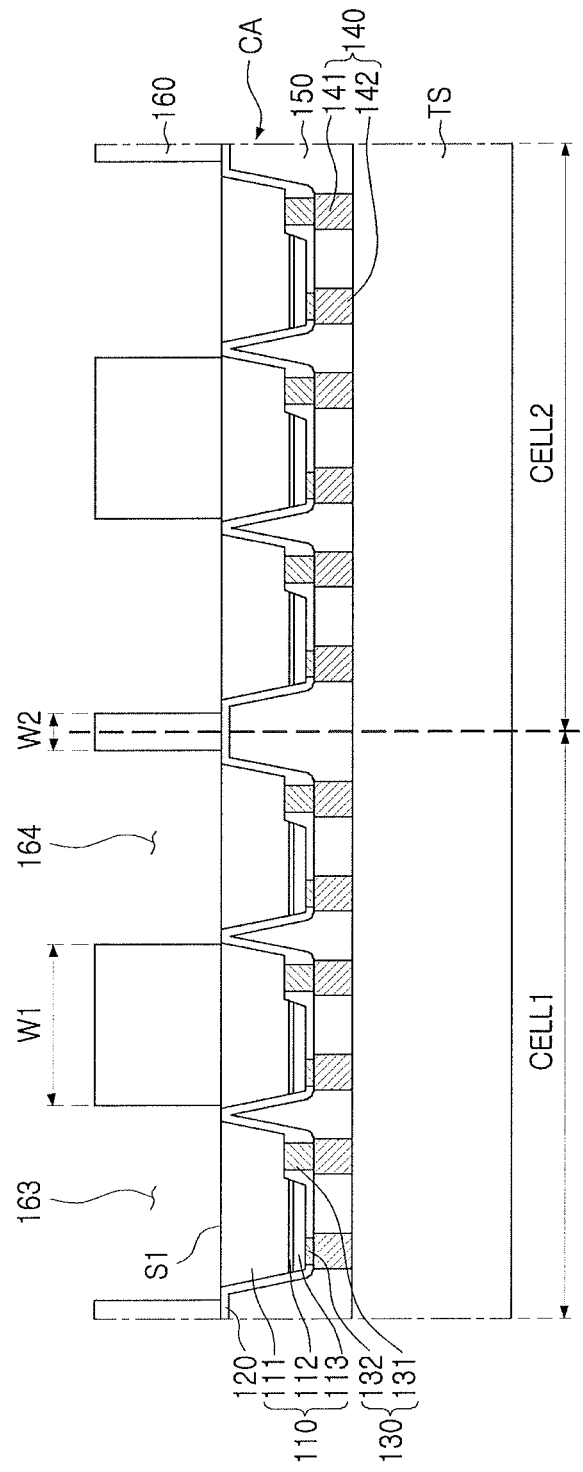
FIGS. 8 to 13 illustrate schematic side cross-sectional views of stages in a process of manufacturing the light emitting device package of FIG. 5.

First, as illustrated in FIG. 8, a cell array CA including the light emitting structure 110, the insulating layer 120, the electrode portion 130, the electrode pad part 140, and the molding part 150 may be attached to a temporary substrate TS. The light emitting structure 110 may include the first conductivity-type semiconductor layer 111, the active layer 112, and the second conductivity-type semiconductor layer 113. Further, the insulating layer 120, the electrode portion 130, the electrode pad part 140, and the molding part 150 may surround the light emitting structure 110. Then, a light transmitting material may be deposited on the first surface S1, and first and second recesses 163 and 164 may be formed, thereby forming the light-transmissive partition structure 160.

The first and second recesses 163 and 164 may be formed by removing, e.g., etching, regions corresponding to locations of first and second light emitting devices LED1 and LED2 to be repeatedly formed in pixel units CELL1 and CELL2, e.g., an entirety of first surface S1 thereof, as well as a portion of the insulating layer 120. Alternatively, the first and second recesses may be formed by removing only a portion of light transmissive material used form the light-transmissive partition structure 160, e.g., may be formed to have a same depth or different depths along the thickness direction.

The first and second recesses 163 and 164 may be formed by dry etching the light transmitting material layer using a method such as oxide-deep reactive ion etching (O-DRIE). In addition to this method, various dry or wet etching methods used in the art may also be used. As described above, the light-transmissive partition structure 160 may be formed of a light transmitting insulating material, and may be formed of at least one of $SiO_2$, $SiN_x$, $Al_2O_3$, HfO, $TiO_2$, or ZrO. An interval W1 between the first and second recesses 163 and 164 may be set to a size corresponding to a width of a third light emitting device LED3 of the cell array CA attached in a subsequent process. In addition, an interval W2 between adjacent pixels may be set to a substantially reduced width within a range in which the light-transmissive partition structure 160 is not broken during a subsequent singulation process, e.g., a dicing process.

Figure 9:
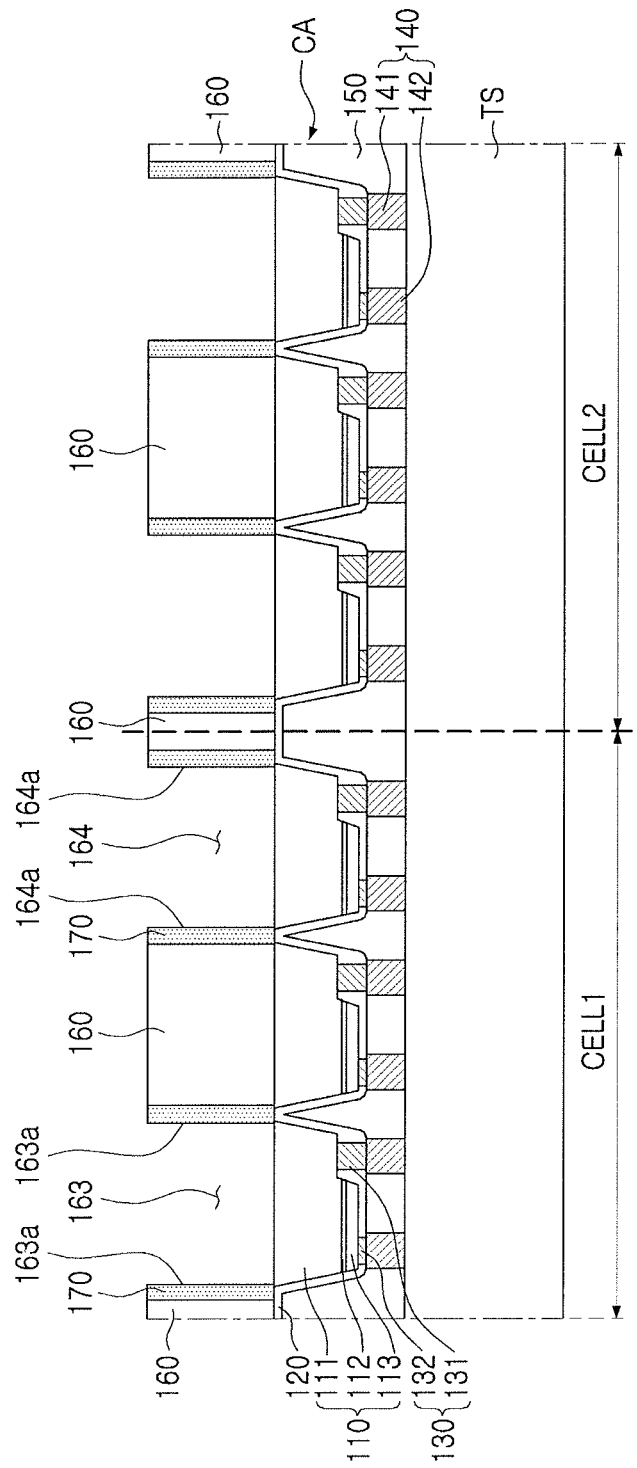

Subsequently, as illustrated in FIG. 9, a reflective layer 170 may be formed on side surfaces 163a and 164a of the first and second recesses 163 and 164. The reflective layer 170 may be formed by depositing a material including at least one of aluminum (Al), ruthenium (Ru), rhodium (Rh), gold (Au), silver (Ag), platinum (Pt), nickel (Ni), chromium (Cr), titanium (Ti) and copper (Cu), which are high reflective metals. The reflective layer 170 may be in contact, e.g., direct contact, with the insulating layer 120. The reflective layer 170 may be formed to only overlap the insulating layer, i.e., not to overlap the light emitting devices, along the thickness direction.

Figure 10:
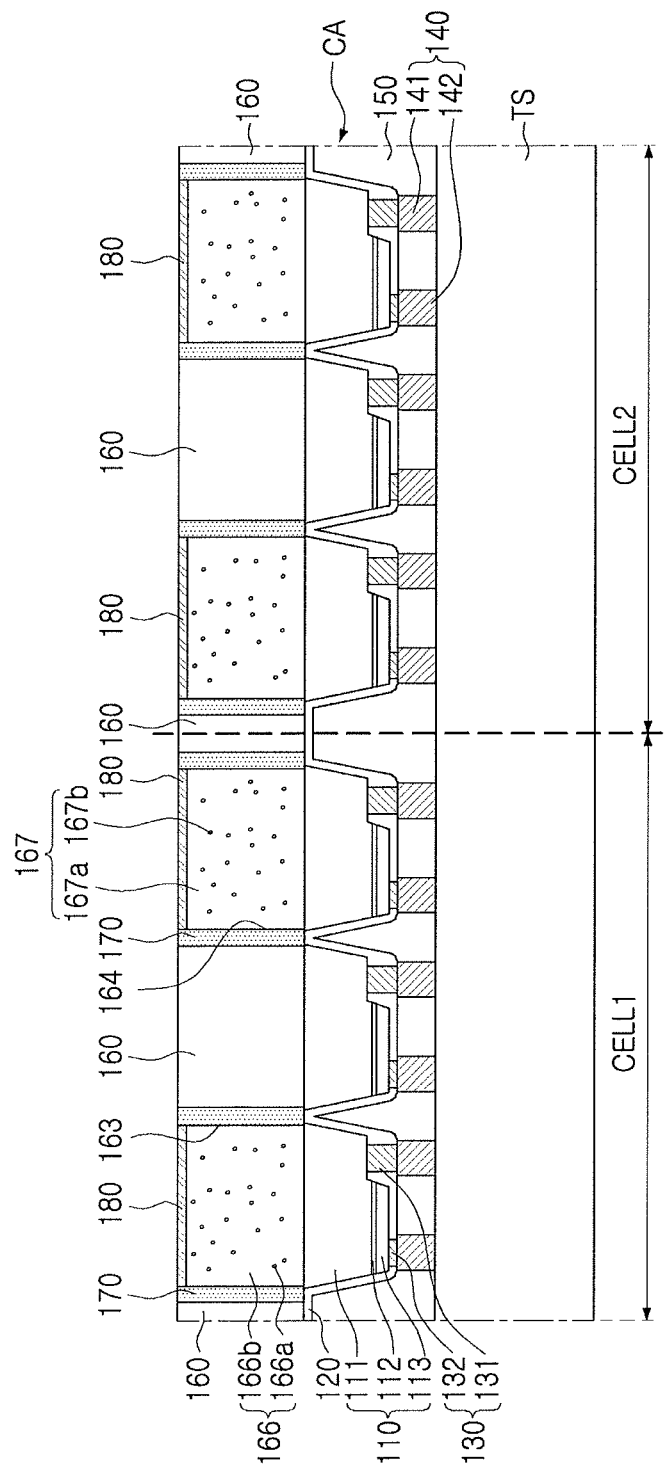

Then, as illustrated in FIG. 10, a first wavelength conversion portion 166 may be formed, e.g., by inkjet printing the light-transmissive liquid resin 166b mixed with red phosphors 166a in the first recess 163, and the second wavelength conversion portion 167 may be formed, e.g., by inkjet printing the light-transmissive liquid resin 167b mixed with green phosphors 167a in the second recess 164. The optical filter layer 180 or the distributed Bragg reflector may be provided on upper surfaces of the first and second wavelength conversion layers 166 and 167.

Figure 11:
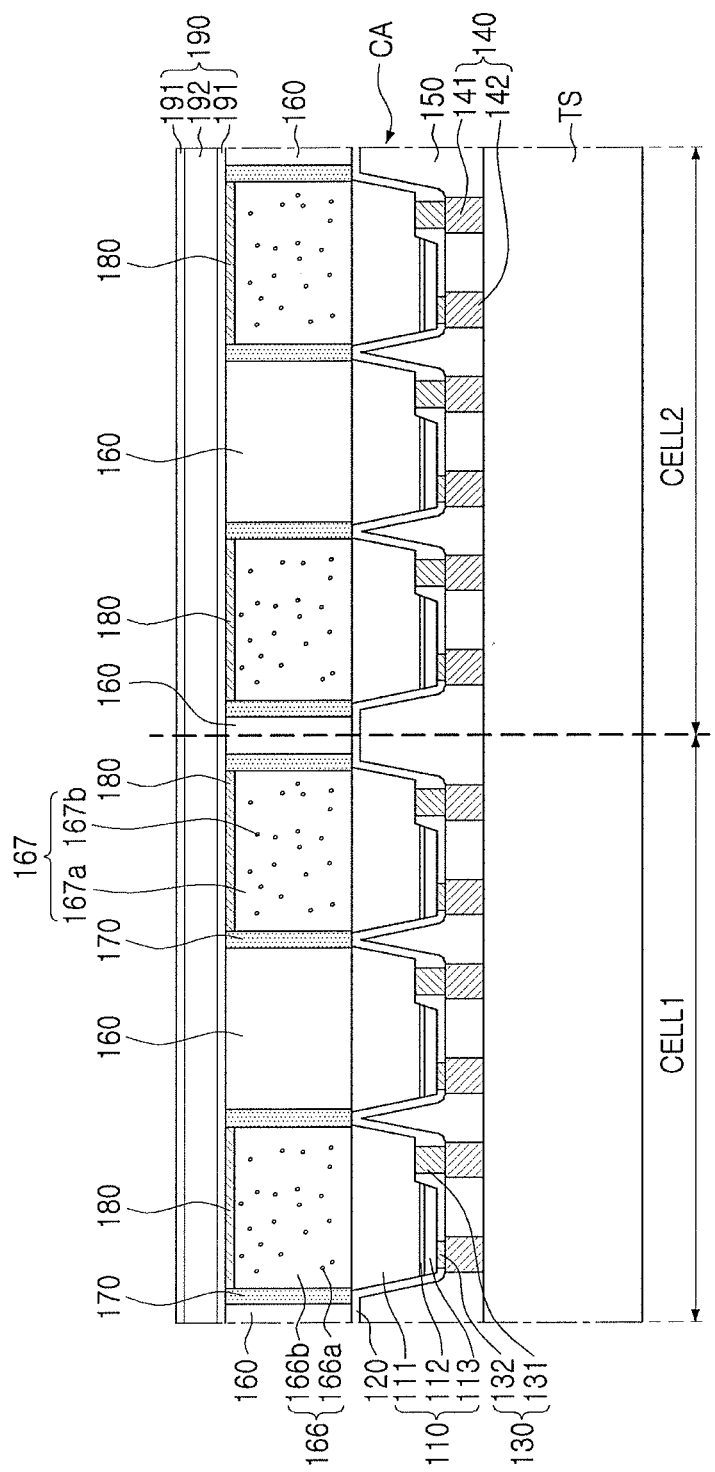

Next, as illustrated in FIG. 11, an encapsulation portion 190 may be disposed to cover the first and second wavelength conversion portions 166 and 167 and the light-transmissive partition structure 160. The encapsulation portion 190 may be formed to have a film shape having a structure in which a plurality of layers are provided, but the shape of the encapsulation portion 190 is not limited thereto. For example, the encapsulation portion 190 may be formed to have a single-layer structure by applying a material layer.

Figure 12:
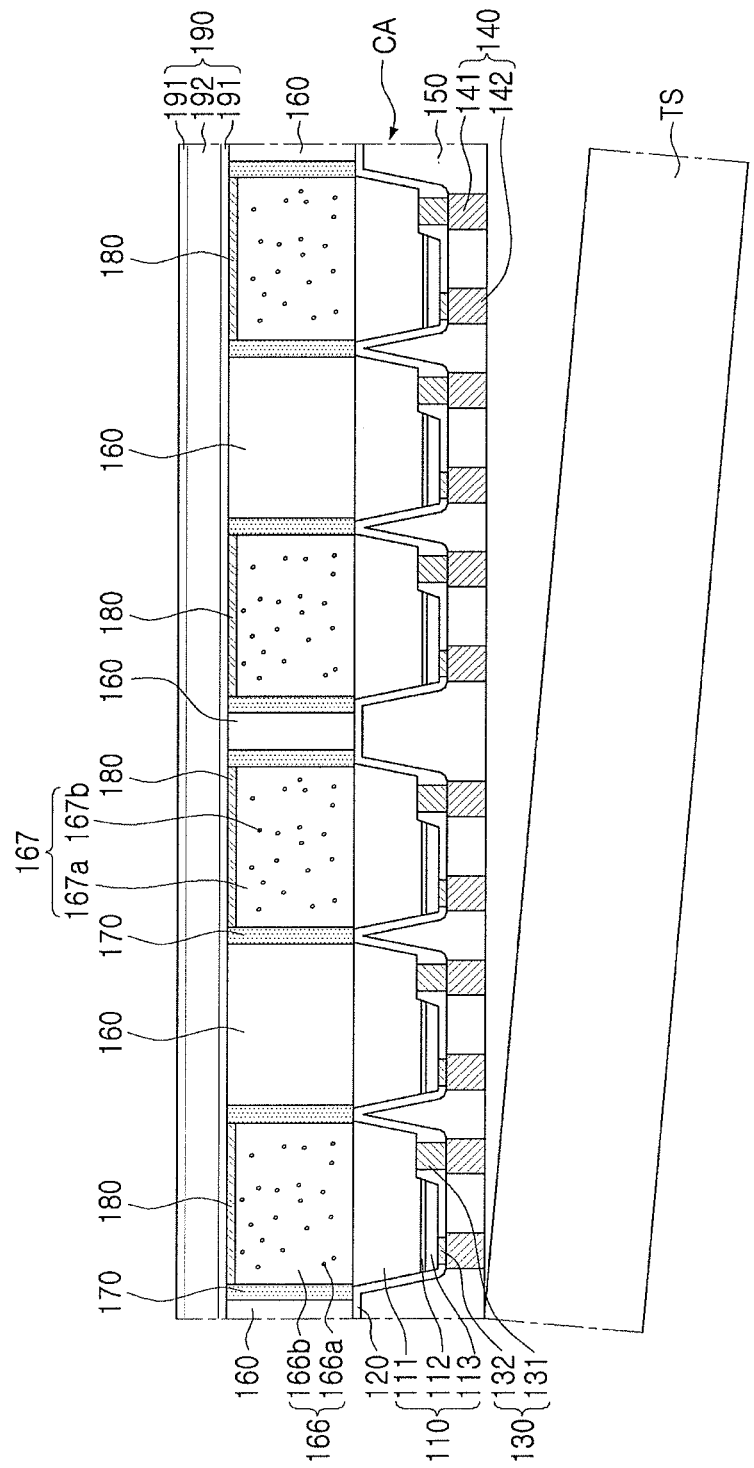

Next, as illustrated in FIG. 12, the temporary substrate TS may be separated from the cell array CA. In this case, a temporary support, e.g., a dicing tape, may be attached on the encapsulation portion 190 to prevent damage to the cell array CA.

Figure 13:
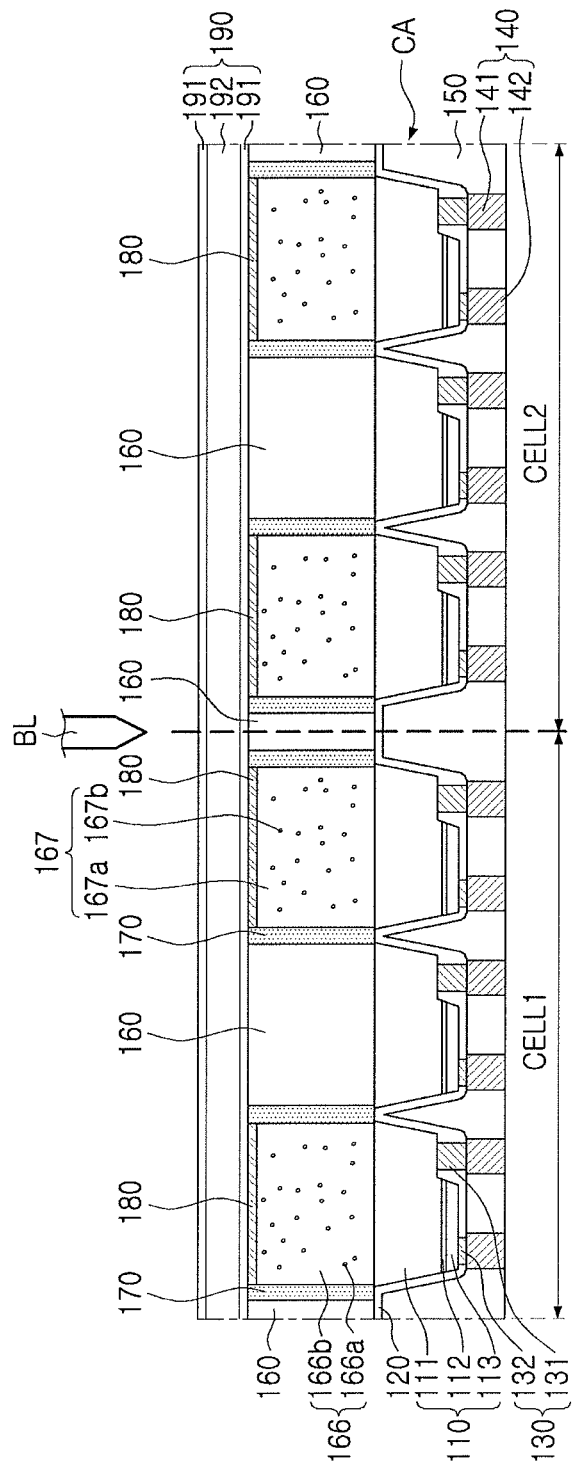

Then, as illustrated in FIG. 13, by performing singulation, e.g., by cutting the light-transmissive partition structure 160 and the cell array CA into pixel units CELL1 and CELL2 using a blade BL, the light emitting device package 10 illustrated in FIG. 5 may be manufactured. Alternatively, singulation may be performed using another method, e.g., using a laser or water jet, or the like.

As set forth above, manufacturing time for a light emitting device package according to an example embodiment and a display device using the same, a manufacturing time thereof may be reduced, and the miniaturization thereof may be relatively easy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device package, comprising:
a first wavelength conversion portion and a second wavelength conversion portion respectively filled in a first recess and a second recess formed in a light-transmissive partition structure to convert a wavelength of incident light to light having a different wavelength to provide the light having a converted wavelength;
the light-transmissive partition structure extending along side surfaces of the first and second wavelength conversion portions in a thickness direction, to separate the first and second wavelength conversion portions along a direction crossing the thickness direction, wherein the light-transmissive partition structure has a multilayer structure formed of materials having different refractive indices; and
a cell array including a first light emitting device, a second light emitting device and a third light emitting device, overlapping, along the thickness direction, the first wavelength conversion portion, the second wavelength conversion portion, and the light-transmissive partition structure, respectively, the cell array having a first surface and a second surface opposing the first surface along the thickness direction, the first surface being closer to the first wavelength conversion portion, the second wavelength conversion portion, and the light-transmissive partition structure.

2. The light emitting device package as claimed in claim 1, wherein the light-transmissive partition structure is formed of a material including $SiO_2$.

3. The light emitting device package as claimed in claim 1, further comprising a reflective layer on a surface of the light-transmissive partition structure in contact with the first and second wavelength conversion portions.

4. The light emitting device package as claimed in claim 3, further comprising an insulating layer extending along the thickness direction between adjacent light emitting devices to electrically isolate the first light emitting device, the second light emitting device and the third light emitting device from each other.

5. The light emitting device package as claimed in claim 4, wherein the insulating layer is in contact with the reflective layer.

6. The light emitting device package as claimed in claim 1, wherein the first light emitting device, the second light emitting device and the third light emitting device emit blue light.

7. The light emitting device package as claimed in claim 6, wherein the first wavelength conversion portion and the second wavelength conversion portion include red phosphors and green phosphors, respectively.

8. The light emitting device package as claimed in claim 1, wherein the first light emitting device, the second light emitting device, and the third light emitting device are parallel to each other along the thickness direction, and the third light emitting device is between the first and second light emitting devices along the direction crossing the thickness direction.

9. The light emitting device package as claimed in claim 1, further comprising at least one of an optical filter layer and a distributed Bragg reflector (DBR) above and overlapping upper surfaces of the first and second wavelength conversion portions.

10. The light emitting device package as claimed in claim 1, wherein the first and second wavelength conversion portions and the light-transmissive partition structure have substantially a same thickness.

11. The light emitting device package as claimed in claim 1, further comprising an encapsulation portion covering and sealing the first and second wavelength conversion portions.

12. The light emitting device package as claimed in claim 11, wherein the encapsulation portion has a film shape, and is attached to the first and second wavelength conversion portions and the light-transmissive partition structure.

13. The light emitting device package as claimed in claim 1, wherein a width of each of the first and second wavelength conversion portions is substantially the same as a distance by which the first and second wavelength conversion portions are spaced apart from each other along the direction crossing the thickness direction.

14. A light emitting device package, comprising:
a light-transmissive partition structure including a first recess and a second recess extending in a thickness direction, a portion of the light-transmissive partition structure separating the first recess and second recess along a direction crossing the thickness direction;
a first wavelength conversion portion and a second wavelength conversion portion to fill the first recess and the second recess, respectively, and to convert a wavelength of incident light to provide light having a converted wavelength; and
a cell array including a first light emitting device, a second light emitting device and a third light emitting device, overlapping the first wavelength conversion portion, the second wavelength conversion portion and the portion of the light-transmissive partition structure, respectively, along the thickness direction.

15. The light emitting device package as claimed in claim 14, wherein the first and second recesses are provided with a reflective layer on side surfaces of the first and second recesses.

16. The light emitting device package as claimed in claim 14, wherein the first and second wavelength conversion portions include a phosphor or a quantum dot.

17. The light emitting device package as claimed in claim 14, wherein the first and second wavelength conversion portions and the light-transmissive partition structure are formed of a material having substantially a same refractive index.

18. The light emitting device package as claimed in claim 14, wherein the first and second recesses have substantially a same area.

19. A display device, comprising:
a display panel including a circuit board and a plurality of light emitting device packages arranged in rows and columns on the circuit board, each of the plurality of light emitting device packages providing a single pixel;
a driving unit driving the display panel; and
a control unit controlling the driving unit,
wherein the display panel includes:
a first wavelength conversion portion and a second wavelength conversion portion respectively filled in a first recess and a second recess formed in a light-transmissive partition structure to convert a wavelength of incident light to provide light having a converted wavelength;

the light-transmissive partition structure extending along side surfaces of the first and second wavelength conversion portions along a thickness direction to separate the first and second wavelength conversion portions along a direction crossing the thickness direction, wherein the light-transmissive partition structure has a multilayer structure formed of materials having different refractive indices; and a cell array including a first light emitting device, a second light emitting device and a third light emitting device, overlapping the first wavelength conversion portion, the second wavelength conversion portion and the light-transmissive partition structure, respectively.

* * * * *